US012591011B1

(12) United States Patent
Tiwari et al.

(10) Patent No.: US 12,591,011 B1
(45) Date of Patent: Mar. 31, 2026

(54) HEURISTIC-BASED ADAPTIVE SYSTEM FOR USE WITH ONE OR MORE NUMERICAL RELAYS

(71) Applicant: Schneider Electric USA, Inc., Boston, MA (US)

(72) Inventors: Pranshu Tiwari, Grafton, MA (US); Frederique Roffet, Coublevie (FR); Aditya Kaveti, North Andover, MA (US)

(73) Assignee: Schneider Electric USA, Inc., Boston, MA (US)

( * ) Notice: Subject to any disclaimer, the term of this patent is extended or adjusted under 35 U.S.C. 154(b) by 0 days.

(21) Appl. No.: 18/978,714

(22) Filed: Dec. 12, 2024

(51) Int. Cl.
  G01R 31/327 (2006.01)
  G01R 31/08 (2020.01)
(52) U.S. Cl.
  CPC ....... G01R 31/3278 (2013.01); G01R 31/086 (2013.01)
(58) Field of Classification Search
  CPC .......................... G01R 31/3278; G01R 31/086
  See application file for complete search history.

(56) References Cited

PUBLICATIONS

Y. Zhang et al., "Application of Support Vector Machine Classification to Enhanced Protection Relay Logic in Electric Power Grids," 2007 Large Engineering Systems Conference on Power Engineering, Montreal, QC, Canada, 2007, pp. 31-38.
AllumiaX LLC.,"Relay setting in real power system. https://www.allumiax.com/blog/relay-settings-in-real-power-system", Oct. 29, 2022, 11 pages.
Czakon, J., "F1 Score vs ROC AUC vs Accuracy vs PR AUC: Which Evaluation Metric Should You Choose?" neptune.ai. https://neptune.ai/blog/f1-score-accuracy-roc-auc-pr-auc#:~:text=F1%20score%20vs%20Accuracy&text=That%20makes%20a%20big%20difference,the%20metric%20you%20should%20choose, Sep. 10, 2024, 25 pages.
Mukherjee, "Adaptive Protective Relay Settings—A Vision to the Future" https://www.osti.gov/servlets/purl/1863312, 2022, 8 pages.
Phanibabu, "Over current/Earth fault Relays [50/51]: Electrical Engineering Materials. https://electengmaterials.com/over-current-earth-fault-relays-50-51/", 2022, 8 pages.

*Primary Examiner* — Robert L Deberadinis
(74) *Attorney, Agent, or Firm* — Stinson LLP

(57) ABSTRACT

An adaptive system is implemented for use with one or more numerical relays. A plurality of features associated with relay operational profile data is input into a plurality of candidate models, and each candidate model is evaluated for one or more performance metrics. A predictive model is selected for fault detection based on the sensitivity and specificity of the predictive model, and a metaheuristic process is used to evaluate various combinations of relay settings for the numerical relays in an electrical network and determine a first set of relay settings based on the evaluation. The electrical network is monitored to detect one or more relay state transitions indicative of one or more changes in relay performance or network conditions, and if one or more relay state transitions are detected, the first set of relay settings are adjusted to enhance performance of the electrical network.

20 Claims, 4 Drawing Sheets

FIG. 1

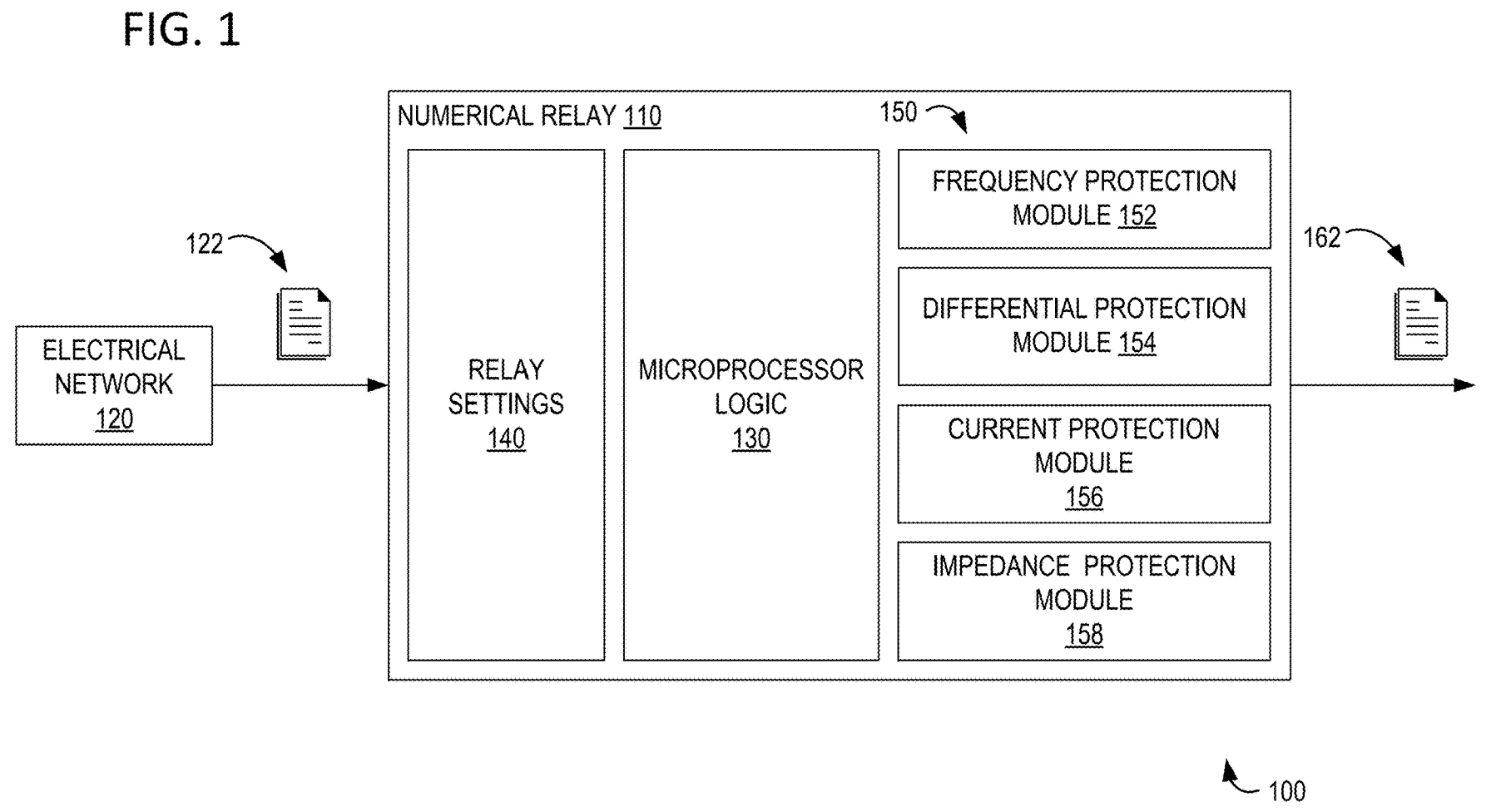

NUMERICAL RELAY 110

RELAY SETTINGS 140

MICROPROCESSOR LOGIC 130

150

FREQUENCY PROTECTION MODULE 152

DIFFERENTIAL PROTECTION MODULE 154

CURRENT PROTECTION MODULE 156

IMPEDANCE PROTECTION MODULE 158

162

100

ELECTRICAL NETWORK 120

122

HEURISTIC-BASED ADAPTIVE SYSTEM FOR USE WITH ONE OR MORE NUMERICAL RELAYS

BACKGROUND

Current relays are used in power systems to monitor and detect electrical faults, such as short circuits, overloads, and other abnormalities. When a fault is detected, current relays trigger a signal to trip a breaker or activate another protective mechanism to disconnect or isolate a faulty section, helping to maintain the safety and integrity of the power system. However, traditional current relays are limited by fixed fault detection thresholds, such as predefined current values, which can result in incorrect fault detection.

Numerical relays offer improvements over traditional current relays by providing greater flexibility and customization. However, once deployed, known numerical relays are typically left with their initial configurations unchanged, which impairs their ability to effectively respond to dynamic grid conditions, such as load fluctuations or environmental factors, potentially leading to unnecessary downtime, reduced productivity, and increased maintenance costs.

SUMMARY

Aspects of the present disclosure enable enhanced reliability, resilience, and/or performance of power systems by providing adaptive relay settings that respond to dynamic grid conditions. In one aspect, a method is provided for implementing an adaptive system for use with one or more numerical relays. The method includes inputting a plurality of features associated with relay operational profile data into a plurality of candidate models, evaluating each candidate model for one or more performance metrics including sensitivity and specificity to identify one or more fault-related patterns in the relay operational profile data, selecting a predictive model for fault detection based on the sensitivity and specificity of the predictive model, using a metaheuristic process to evaluate various combinations of relay settings for the numerical relays in an electrical network and determine a first set of relay settings for the numerical relays based on the evaluation, monitoring the electrical network to detect one or more relay state transitions indicative of one or more changes in relay performance or network conditions, and on condition that one or more relay state transitions are detected, adjusting the first set of relay settings to enhance performance of the electrical network.

In another aspect, an adaptive system is provided for use with one or more numerical relays. The adaptive system includes a nodal fault predictor, a metaheuristic module, and a monitoring module. The nodal fault predictor inputs a plurality of features associated with relay operational profile data into a plurality of candidate models, evaluates each candidate model of the plurality of candidate models for one or more performance metrics including sensitivity and specificity to identify one or more fault-related patterns in the relay operational profile data, and selects a predictive model from the plurality of candidate models for fault detection based on the sensitivity and specificity of the predictive model. The metaheuristic module evaluates various combinations of relay settings for the numerical relays in an electrical network and determines a first set of relay settings for the numerical relays based on the evaluation. The monitoring module monitors the electrical network to detect one or more relay state transitions indicative of one or more changes in relay performance or network conditions, and, on condition that one or more relay state transitions are detected, adjusts the first set of relay settings to enhance performance of the electrical network.

In yet another aspect, a system is provided for implementing an adaptive system. The system includes one or more numerical relays, and a computing device configured to input a plurality of features associated with relay operational profile data into a plurality of candidate models, evaluate each candidate model of the plurality of candidate models for one or more performance metrics including sensitivity and specificity to identify one or more fault-related patterns in the relay operational profile data, selecting, from the plurality of candidate models, a predictive model for fault detection based on the sensitivity and specificity of the predictive model, using a metaheuristic process to evaluate various combinations of relay settings for the one or more numerical relays in an electrical network and determine a first set of relay settings for the one or more numerical relays based on the evaluation, monitoring the electrical network to detect one or more relay state transitions indicative of one or more changes in relay performance or network conditions, and on condition that one or more relay state transitions are detected, adjusting the first set of relay settings to enhance performance of the electrical network.

Other aspects and features of the present disclosure will be in part apparent and in part pointed out herein. This Summary is provided to introduce a selection of concepts in a simplified form that are further described below in the Detailed Description. This Summary is not intended to identify key features or essential features of the claimed subject matter, nor is it intended to be used in isolation as an aid in determining the scope of the claimed subject matter.

BRIEF DESCRIPTION OF THE DRAWINGS

Aspects of the present disclosure are described in detail below with reference to the attached drawing figures, wherein:

FIG. 1 is a relay architecture diagram illustrating an example system including a numerical relay;

Corresponding reference numbers indicate corresponding parts throughout the drawings.

DETAILED DESCRIPTION

Figure 2:
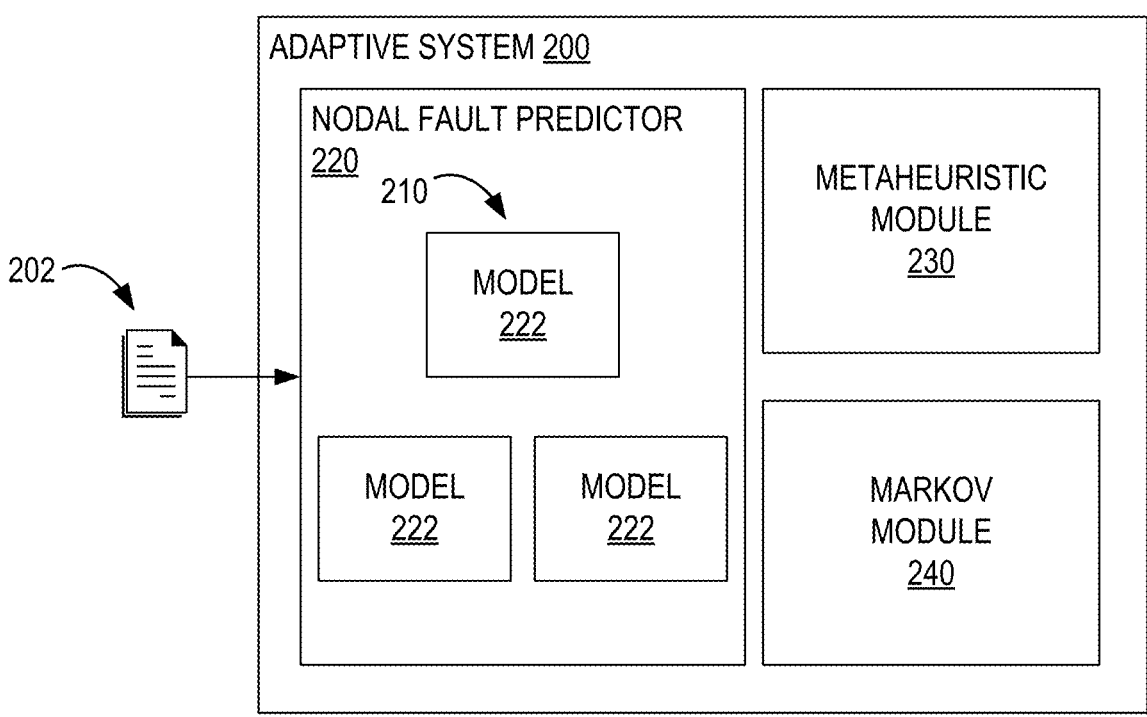
FIG. 2 is a block diagram illustrating an example adaptive system.

Aspects of the disclosure enable relay settings to be automatically adjusted based on dynamic grid conditions. Examples described herein input a plurality of features associated with relay operational profile data into a plurality of candidate models, and evaluate each candidate model for one or more performance metrics to identify one or more fault-related patterns in the relay operational profile data. A predictive model is determined for fault detection, and a metaheuristic process is used to evaluate various combinations of relay settings and determine a first set of relay settings for one or more numerical relays. The electrical network is monitored to detect one or more relay state transitions indicative of one or more changes in relay performance or network conditions. If one or more relay state transitions are detected, the first set of relay settings may be adjusted to enhance performance of the electrical network.

Aspects of the present disclosure provide for a computing system that performs one or more operations in an environment including a plurality of devices coupled to each other via a network (e.g., a local area network (LAN), a wide area network (WAN), the internet). The systems and methods described herein may be implemented using computer programming or engineering techniques including computer software, firmware, hardware, or a combination or subset thereof. Unless defined otherwise, all technical and scientific terms used herein have the same meaning as commonly understood by one of ordinary skill in the art to which the present disclosure belongs. Although any methods and materials similar to or equivalent to those described herein can be used in the practice or testing of the present disclosure, some preferred methods and materials are described below.

The systems and methods disclosed herein provide a technological solution to technical problems by using advanced modeling techniques to conduct performance evaluations and implement adaptive protection schemes. The technical effect of the systems and methods described herein is achieved by using a computing system configured to perform one or more of the following operations: (i) inputting a plurality of features associated with relay operational profile data into a plurality of candidate models; (ii) evaluating each candidate model of the plurality of candidate models for one or more performance metrics to identify one or more fault-related patterns in the relay operational profile data; (iii) selecting a predictive model for fault detection based on the sensitivity and specificity of the predictive model; (iv) using a metaheuristic process to evaluate various combinations of relay settings for the numerical relays in an electrical network and determine a first set of relay settings for the one or more numerical relays based on the evaluation; (v) monitoring the electrical network to detect one or more relay state transitions indicative of one or more changes in relay performance or network conditions; and (vi) adjusting the first set of relay settings to enhance performance of the electrical network.

FIG. 1 shows an example system 100 including a numerical relay 110 configured to provide multi-functional protection in a power system or electrical network 120. The electrical network 120 may include various components, such as a generator (e.g., to produce power), transmission lines (e.g., to transmit power), and/or loads (e.g., to consume power). In some examples, the electrical network 120 may include one or more transformers, such as power transformers for transmitting electrical power at high voltage levels over long distances, distribution transformers for stepping down voltage levels to meet consumer demands, and/or instrument transformers, such as voltage transformers (VTs) and current transformers (CTs), for monitoring and measuring electrical parameters in the electrical network 120.

As shown in FIG. 1, the numerical relay 110 may receive one or more input signals 122 from the electrical network 120 that represent real-time network conditions, such as voltage, current, and frequency. For example, the numerical relay 110 may receive a first input signal 122 representing three-phase voltage measured by a voltage transformer (VT) coupled to a high-voltage bus and/or a second input signal 122 representing three-phase current measured by a current transformer (CT) coupled to a current-carrying transmission line. In some examples, the first input signal 122 may include three channels, each corresponding to one phase of the three-phase voltage, and/or the second input signal 122 may include three channels, each corresponding to one phase of the three-phase current. In some examples, the VT and/or CT may step down voltage and current, respectively, to levels that are safe and compatible with monitoring and protection devices, such as the numerical relay 110, ensuring the protection of sensitive equipment from high-power system conditions.

The numerical relay 110 is configured to process the input signals 122 using microprocessor logic 130, which may leverage one or more digital processing techniques, algorithms, and predefined relay settings 140 to monitor network conditions, detect abnormalities or faults (e.g., overcurrent, phase loss, voltage imbalance), and execute protection functions. For example, the numerical relay 110 may monitor the first input signal 122 from the VT to detect under/overvoltage or frequency deviations and/or the second input signal 122 from the CT to detect overloads, short circuits, or ground faults.

In some examples, the microprocessor logic 130 may include and/or communicate with one or more protection modules 150, each configured or tailored to perform specific protection functions. Example protection modules 150 may include, without limitation, a frequency protection module 152 to monitor frequency and trigger actions when frequency thresholds are exceeded, a differential protection module 154 to detect internal faults in equipment (e.g., transformers), a current protection module 156 to monitor current and trigger actions when current thresholds are exceeded, and an impedance protection module 158 to measure impedance for distance protection along transmission lines.

The relay settings 140 define one or more parameters (e.g., thresholds, time delays, inverse characteristics) that determine how the numerical relay 110 reacts to system conditions. In some examples, the relay settings 140 may be tailored or specific to each protection module 150 to enhance sensitivity (e.g., fault detection accuracy), specificity (e.g., avoidance of false positives), adaptability (e.g., handling varying system conditions), and/or responsiveness (e.g., prompt detection and action). Additionally or alternatively, the relay settings 140 may be tailored or specific to each channel of the input signals 122. For example, the relay settings 140 for a channel corresponding to one phase of the first input signal 122 (e.g., from the VT) may include a higher voltage threshold than that the other two voltage channels due to specific load conditions, while the current channels (e.g., from the CT) may not include voltage thresholds at all. In some examples, one or more protection modules 150, like the differential protection module 154 or current protection module 156, may operate based on specific channels (e.g., current channels), while one or more others, like the frequency protection module 152 or impedance protection module 158, may operate based on combined data from multiple channels.

The numerical relay 110 is configured to generate and transmit one or more output signals 162 to indicate faults and coordinate protection actions. Example output signals 162 may include, without limitation, trip signals that instruct circuit breakers or other protective devices to isolate faults and time-to-trip signals that define delays to help prevent false trips and maintain system stability. In some examples, the delay duration may be adjusted based on the type or nature of the fault. For example, a short circuit may have a shorter delay (e.g., milliseconds) to isolate the fault quickly and prevent damage, whereas less severe faults (e.g., overloads) may have longer delays, which may be inversely proportional to the severity of the fault. This approach allows the system 100 to disregard temporary fluctuations or minor abnormalities, which helps avoid unnecessary downtime. Additionally or alternatively, delay durations may be used to facilitate coordination among protection devices, ensuring a proper sequence of events and reducing the likelihood of fault propagation within the electrical network 120. For example, upstream protection devices may have longer delays than downstream protection devices, allowing the downstream protection devices to isolate the fault first.

In some examples, the numerical relay 110 may communicate with a control system using communication protocols (e.g., IEC 61810, IEC 61850, or Modbus) to integrate with supervisory control and data acquisition (SCADA) systems to provide real-time network status, alarms, and performance data, supporting monitoring and maintenance.

FIG. 2 shows an example adaptive system 200 that be used to enhance the reliability, resilience, and/or performance of various systems, such as industrial equipment (e.g., numerical relay 110), electrical grids (e.g., electrical network 120), or other automated systems. The adaptive system 200 is configured to dynamically adjust its configurations, settings, or operational behavior in response to changes in environmental or operational conditions. The adaptive system 200 achieves these enhancements by leveraging relay operational profile data, or data 202, to train and/or validate a predictive model 210. The predictive model 210 may be used to continuously analyze and learn from the data 202, enabling the adaptive system 200 to proactively anticipate, diagnose, and respond to varying conditions, including potential faults or anomalies. This dynamic adaptability ensures that the adaptive system 200 operates optimally under both normal and fault conditions, reducing downtime and improving system efficiency.

The data 202 may be sourced from various sources, including historical and simulated signals. The integration of these two types of data enables the development of reliable, resilient, and/or effective predictive models 210 that care capable of operating in complex, dynamic environments and proactively addressing emerging challenges, including system faults and disruptions.

Historical data includes real-world data that has been collected over time and reflects the system's actual operational behavior under normal and fault conditions. This data may be received or retrieved from various components of the system, such as relays (e.g., numerical relay 110). Historical data encompasses a wide range of parameters, including voltages, currents, power levels, and configuration settings (e.g., relay settings 140) recorded at different nodes within the system. Historical data serves as the foundation for training the predictive model 210 by providing insights into past behaviors, system performance, and response patterns under diverse scenarios. By analyzing this data, the predictive model 210 may learn about various operating conditions, such as load variations, environmental factors, and fault events. For example, historical data may include data from time periods associated with various conditions, such as peak and off-peak load levels, changes in system topology (e.g., line outages or reconfigurations), and various fault types. This enables the predictive model 210 to understand operational nuances and historical trends that influence system behavior.

Simulated Data is generated to replicate potential scenarios that may not be reflected in the historical data but are relevant for training the predictive model 210. To generate this data, specific assumptions may be made including, without limitation, (i) loads are treated as random variables with a uniform distribution within a range defined by Pmin load and Pmax load; (ii) loads are modeled as constant power sinks; and/or (iii) short-circuit faults may occur at any location within the system, including midline locations. Simulated operational data may be derived through power flow analysis, which models how power is distributed through the system under normal operating conditions. This analysis captures baseline system behavior, including voltages, currents, power levels, and configuration settings (e.g., relay settings 140) at various nodes and branches of the system during non-fault conditions. This analysis may be performed across varying load levels (e.g., peak and off-peak conditions) to account for normal operational variability. Additionally, fault analysis may be conducted to simulate various fault conditions and their effects on the system. This includes short circuits, overloads, equipment failures, or other disruptions under diverse system topologies (e.g., line outages, reconfigurations). Fault analysis involves capturing deviations in features such as voltage, current, and power from their normal values during fault conditions. This data provides valuable insights into system responses to faults, enabling the predictive model 210 to identify, predict, and respond to anomalies effectively. The inclusion of both normal and fault scenarios in the simulated data ensures that the predictive model 210 is trained to distinguish between healthy operational states and faulty conditions. This dual approach enhances the model's ability to generalize across real-world variations, improving its accuracy in identifying, predicting, and mitigating faults while maintaining efficient system performance.

The adaptive system 200 includes a nodal fault predictor 220 configured to receive or retrieve data 202 and employ advanced machine learning techniques, such as double cross-validation, to develop or determine a predictive model 210 that is configured to detect faults at one or more nodes or connection points within the system. In some embodiments, the nodal fault predictor 220 may evaluate a plurality of candidate models 222 based on performance metrics, including their ability to accurately classify fault and non-fault conditions, and select the predictive model 210 from the plurality of candidate models 222 based on at least sensitivity (accurate fault detection) and specificity (accurate identification of normal conditions), ensuring both accurate fault detection and mitigating false alarms.

To facilitate model evaluation and/or selection, the nodal fault predictor 220 may analyze the data 202 and extract or identify one or more characteristics or features from the data 202, which may include historical and/or simulated data. Features represent measurable or derived characteristics or properties of the system. Example features 212 may include, without limitation, system-based characteristics (e.g., voltage, current, frequency, real power, reactive power, configuration data), time-based characteristics (e.g., trends, periodic behaviors, other temporal patterns), statistical characteristics (e.g., averages, standard deviations, percentiles), and/or anomalous behavior indicators (e.g., deviations from normal operating conditions indicative of potential faults). These features 212 may be used as inputs to the candidate models 222 for analysis.

To achieve this, the nodal fault predictor 220 may operate in one or more modes: i) a Root Mean Square (RMS) mode that calculates the magnitude of time-varying signals to detect anomalies or abnormal variations (e.g., spikes, dips) in voltage or current indicative of faults, or ii) a Wavelet-Gabor Transformation (WGT) mode that decomposes signals into time-localized and frequency-localized components and analyzes the signals across multiple scales to detect sudden and transient faults. In the WGT mode, the signals may be represented as time-frequency images (e.g., spectrograms, wavelet-scalograms). Either or both modes may be used to process signals or data using a convolutional neural network (CNN). By leveraging the RMS and WGT modes, the nodal fault predictor 220 may extract detailed features 212, such as RMS amplitude or instantaneous values and time-frequency characteristics, ensuring the predictive model 210 can detect both major faults and subtle anomalies.

In some examples, the nodal fault predictor 220 may operate on training data X, which may be defined as:

$$X \in R^{m \times L}, \tag{Eq. 1a}$$

where R represents the set of real numbers, m represents the number of features in the waveform data (e.g., voltage, current), and L represents the length of the time series for each feature. Here, the training data X may be embodied as a matrix with m rows corresponding to the features and L columns representing the time-series data. In some examples where wavelet or Gabor transformation is applied, the training data X may also be defined as:

$$X \in R^{F \times m \times L}, \tag{Eq. 1b}$$

where F represents a frequency span or the number of frequency components, m represents the number of signals subjected to the wavelet or Gabor transformation, and L represents the time duration (or the number of time steps) over which the wavelet or Gabor transformation is performed.

In some examples, the nodal fault predictor 220 may extract a subset or slice of the training data X, which may be expressed as:

$$X(T:T+n) \in R^{m \times (n+1)}, \tag{Eq. 2a}$$

where T represents a starting index, and n represents an offset, indicating that the slice spans a time window from T to T+n, inclusive. For example, if n=2, the slice would include three steps (T, T+1, and T+2), and the resulting slice would have dimensions m×3. Alternatively, the slice may span any number of steps that enables the system 200 to function as described herein. In wavelet or Gabor transformation, the image or data may be convolved in both the time and frequency domains. Therefore, the representation of the transformed data may be expressed as:

$$X(T:T+n, f:f+f') \in R^{(f'+1) \times m \times (n+1)}, \tag{Eq. 2b}$$

where f' represents the frequency slice length used for convolution, and n represents the time slice length used for convolution.

To extract one or more meaningful features, the nodal fault predictor 220 may apply a learnable weight matrix or kernel $W_k$ defined as:

$$W_k \in R^{m \times 3}, \tag{Eq. 3}$$

where the kernel maps m features to three dimensions. For example, the kernel $W_k$ may be convolved along one dimension in the RMS mode and along two dimensions in the WGT mode. The individual values in the kernel $W_k$ may be adjusted iteratively by each layer of the CNN, based on an error or loss function, to optimize the detection of patterns such as edges or textures and capture both time and frequency characteristics of the signals.

In some examples, each layer of the CNN may apply one or more transformations, activations, and/or operations as defined by the following equations:

$$Y_1(T) = \sim f_w(X) : W_k \cdot X(T:T+n)^T [\text{RMS mode}], \tag{Eq. 4a}$$

$$Y_1(T) = \sim f_w(X) : W_k \cdot X(T:T+n, f:f+f')^T [WGT \text{ mode}], \tag{Eq. 4b}$$

$$Y_2(T) = g_w'/(Y_1(T)), g_w \sim (W \cdot Y_1(T:T+n)^T) \text{RELU[RMS mode]}, \tag{Eq. 5a}$$

$$Y_2(T) = g_w'/(Y_1(T,F)), g_w \sim (W \cdot Y_1(T:T+n, F:f+f')^T) \text{RELU} [WGT \text{ mode}], \tag{Eq. 5b}$$

$$Y_3(T) = H_w(Y_2(T)) \sim h_w : \text{Max Pooling}(Y_2(T)) [\text{RMS mode}], \tag{Eq. 6a}$$

$$Y_3(T) = H_w(Y_2(T,F)) \sim h_w : \text{Max Pooling}(Y_2(T,F)) [WGT \text{ mode}], \tag{Eq. 6b}$$

where $Y_1(T)$, $Y_2(T)$, and $Y_3(T)$ represent the results or outputs at each layer. For example, the first layer may apply a function $f_w$ to the input slice X(T:T+n) to extract one or more features via convolution with the kernel $W_k$, resulting in a first intermediate representation $Y_1(T)$. The second layer may apply a function $g_w'$ to the first intermediate representation $Y_1(T)$ to refine the features using one or more transformations and/or nonlinear activations, resulting in a second intermediate representation $Y_2(T)$. The third layer may apply a function $H_w$ to the second intermediate representation $Y_2(T)$ to pool and aggregate the features, resulting in an output $Y_3(T)$ with a dimensionality of p, which corresponds to the number of anomaly predictions.

In some examples, the output $Y_3(T)$ may be expressed as:

$$Y_3(T) \in R^p, \tag{Eq. 7}$$

where p represents the number of anomaly predictions. These predictions may represent various fault types, including, but not limited to, voltage-related faults (e.g., overvoltage fault, undervoltage fault, voltage imbalance), current-related faults (e.g., overcurrent fault, time-inverse current, differential current fault, ground fault, short circuit fault), phase-related faults (e.g., phase loss, load imbalance), frequency-related faults (e.g., frequency fault), connection-related faults (e.g., open circuit fault, reverse power fault), equipment- or system-specific faults (e.g., arc fault, insulation failure), power quality faults (e.g., harmonic distortion), and/or thermal/energy-related faults (e.g., overload fault). To analyze these faults, the nodal fault predictor 220 may generate or create a fault matrix based on relay settings, allowing for systematic identification and classification of faults.

In a simplified case, a single convolution layer for RMS or instantaneous values may be modeled or represented as follows:

$$Y_k(T) = \text{SoftMax}(\text{Max Pool}(f_w(X))), \tag{Eq. 8}$$

$$f_w(X) \sim W_{k1} \cdot (T:T+n)^T, \tag{Eq. 9}$$

$$Y_k(T) = f_{k,p,m}(X), \tag{Eq. 10, simplified form}$$

$$f_{k,p,m} = \text{SoftMax}(\text{MaxPool}(f_w)) \tag{Eq. 11}$$

where k represents the fault type, p represents the protection scheme, and m represents the actuating parameter causing the fault. This modeling approach may lead to the creation of Table 1, summarizing relationships between predictive parameters and protection schemes derived from the predictive model 210.

TABLE 1

| Protection Scheme (p) | Actuating Parameter (m) | Operational Mode | Type of Fault (k) | Existing Relay Operation Regime |
|---|---|---|---|---|
| Distance Protection | Current | Time Inverse/ Current | $f_{k1m}(X)$ | $u_{ik}$, |
| Overcurrent Protection | Current | Time Inverse/ Current | $f_{k2m}(X)$ | $u_{ik}$, |
| Direction Protection | Current/ Voltage | Time Inverse/ Current | $f_{k3m}(X)$ | $u_{ik}$, |
| Transformer Protection | Voltage | Time Inverse/ Current | $f_{k4m}(X)$ | $u_{ik}$, |
| Magnetic In-Rush Current | Current | Time Inverse/ Current | $f_{k5m}(X)$ | |

In some examples, the value u, representing relay settings, may be changed or optimized using a metaheuristic module 230 to improve fault detection and enhance system performance. By leveraging kernel convolution in one-dimensional (1D) or two-dimensional (2D) space, the function $f_{k,m}$ may be refined to provide one or more insights into how relay settings u may be adapted for improved protection.

In some examples, one or more features 212 may also be extracted from similar systems or from systems that have experienced similar conditions. Leveraging external data allows the system to improve model performance without requiring extensive new labeled data. This approach enhances the model's ability to generalize to different operating conditions or network topologies, improving the reliability of fault predictions across varied systems.

To select the predictive model 210 and/or enhance the reliability of the predictive model 210, the nodal fault predictor 220 may employ a double cross-validation process including an inner cross-validation stage for tuning model parameters, and an outer cross-validation stage for validating the overall performance of the predictive model 210 using independent data. For example, the predictive model 210 may determine a desired or optimal kernel weight $W_k$ by reducing or minimizing the loss function:

$$L(W) = -\frac{1}{N}\sum_{i=0}^{N} \vec{y_i} \cdot \log(\vec{y_i'}),$$ (Eq. 12)

where $\vec{y_i}$ represents an observed fault vector (e.g., as identified by an engineer), $\vec{y_i'}$ represents a probabilistic fault vector (e.g., as generated by the CNN). In some examples, the kernel weight $W_k$ may be iteratively adjusted or optimized using stochastic gradient descent (SGD), as described by:

$$\overrightarrow{w_{k,n+1}} = \overrightarrow{w_{k,n}} - \eta\sum_{i=1}^{N} \nabla L(\overrightarrow{w_{k,n}})^T,$$ (Eq. 13)

where $\overrightarrow{w_{k,n}}$ represents a current weight at iteration n, $\eta$ represents a learning rate, and $\nabla L$ represents a gradient of the loss function. The nodal fault predictor 220 may iteratively adjust or optimize the kernel weight $W_k$ in batches of data, refining the model's parameters to effectively improve fault detection performance.

In some examples, the nodal fault predictor 220 employs an objective function C to evaluate and/or enhance the reliability of the predictive model 210. The objective function C may be created by comparing values predicted by the candidate model 222 or predictive model 210 with actual values from the data 202. Table 2 illustrates the classification of actual and predicted values:

TABLE 2

| Predicted v. Actual | Actual Fault | Actual No Fault |
|---|---|---|
| Predicted Fault | a | c |
| Predicted No Fault | b | d | where $\alpha$ represents the number of correctly predicted faults (true positives), b represents the number of faults incorrectly predicted as "No Fault" (false negatives), c represents the number of non-faults incorrectly predicted as "Fault", and d represents the number of correctly predicted non-faults (true negatives).

The objective function C is expressed as:

$$C = \emptyset_1 \frac{a}{a+b} + \emptyset_2 \frac{d}{c+d}$$ (Eq. 14)

where $\emptyset_1$ and $\emptyset_2$ are weighting factors, $$\frac{a}{a+b}$$

represents specificity (e.g., the proportion of actual faults correctly predicted), and $$\frac{d}{c+d}$$

represents specificity (e.g., the proportion of actual non-faults correctly predicted).

During the cross-validation process, the candidate model 222 or predictive model 210 are trained and tested using the objective function C, with the goal being to identify the candidate model 222 or predictive model 210 that maximizes C, ensuring a balance between high sensitivity and specificity. This process may also incorporate alternative reliability metrics, such as Shannon's Entropy, to further refine model performance. The cross-validation process ensures the robustness of the predictive model 210 across diverse data sets, enabling the system to predict and respond to faults effectively in complex electrical networks.

The metaheuristic module 230 may be used to determine optimal relay settings 140 for each protection function. For example, given a range of pick-up current, operating modes, and time setting multipliers, the metaheuristic module 230 may identify a set of relay settings 140 that minimizes relay operation time. Specifically, the range of pick-up current refers to an adjustable range of current values that can trigger the numerical relay 110, the operating modes define how the numerical relay 110 responds to faults, such as with or without time delays, and time setting multipliers adjust the delay in relay operation to coordinate with other protective devices. In some examples, a plurality of options are identified and evaluated based on one or more contextual factors. Example contextual factors may include, without limitation, system conditions (e.g., load levels, voltage stability, operating environment), fault-related patterns (e.g., current or voltage deviations, transient faults, location-specific anomalies), network conditions (e.g., protection coordination, system reliability, restoration priorities, regulatory compliance). Given the vast number of potential combinations of relay settings 140 for each protection function, metaheuristic module 230 employs metaheuristic algorithms to facilitate efficient exploration without requiring exhaustive testing of all possible combinations.

In scenarios involving multiple numerical relays 110, the metaheuristic module 230 may employ a genetic algorithm to determine optimal relay settings 140 for each protection function across the numerical relay 110. This process involves: (i) defining an objective function, decision variables, and constraints; (ii) generating a population of possible solutions; (iii) evaluating the reliability and performance of each solution; (iv) selecting one or more high-performing solutions based on predefined criteria (e.g., reliability, speed, safety); (v) performing genetic operations (e.g., crossover, mutation) on the selected solutions to generate new solutions; (vi) evaluating the reliability and performance of each new solution; and (vii) repeating operations (iv)-(vi) until a termination criterion is met (e.g., a maximum number of iterations or convergence to an optimal solution. The genetic algorithm is configured to efficiently explore a broad solution space, enabling the identification of relay settings 140 that enhance fault handling and operational performance within interconnected or complex network configurations. Additionally, the algorithm may be configured to optimize relay settings 140 for reliability, speed, and safety, ensuring effective coordination of numerical relays 110 with other protective devices in the system.

Once the relay settings 140 are determined, they may be implemented in the system. The system may adapt dynamically based on state transitions. For example, a monitoring or Markov module 240 may be configured to monitor relay settings 140 and/or network conditions over time and detect state changes, such as the activation of a relay. The Markov module 240 functions as a checkpoint to determine whether one or more relay settings 140 should be updated. In some examples, the Markov module 240 is configured to evaluate whether the nodal fault predictor 220 and/or the metaheuristic module 230 should be invoked to determine a predictive model 210 and/or relay settings 140, respectively.

If no state change occurs (i.e., no "jump" is detected), the current state is deemed stable, and no action is taken. Continuous evaluation of all relay states using machine learning models can be computationally expensive and unnecessary during stable states. The Markov module 240 optimizes resource usage by limiting the application of machine learning models to instances where state transitions or faults occur.

If a state change occurs but is deemed insignificant, the system maintains its current configuration without further action.

If a state change occurs and is determined to be significant but not sensitive (e.g., unrelated to high-voltage or utility systems), the relay settings 140 may be updated. In some examples, the adaptive system 200 may communicate with the numerical relay 110 using appropriate communication protocols (e.g., IEC 61810, IEC 61850, or Modbus) to implement the updated settings. Subsequently, the nodal fault predictor 220 and/or metaheuristic module 230 may be executed to refine the predictive model 210 and/or relay settings 140, respectively.

If a state change occurs and is determined to be both significant and sensitive (e.g., related to high-voltage or utility systems), the adaptive system 200 may initiate an Electrical Transient Analyzer Program (ETAP) study to ensure the proposed change aligns with industry standards and safety regulations. In some examples, the proposed changes may be reviewed by a professional engineer. For example, a notification may be generated and transmitted to the professional engineer for review. If the ETAP study or engineer do not approve the proposed change, no further action is taken. If the proposed change is approved, the relay settings 140 may be updated, and the adaptive system 200 may communicate with the numerical relay 110 using communication protocols (e.g., IEC 61810, IEC 61850, or Modbus) to implement the updated settings. The nodal fault predictor 220 and/or metaheuristic module 230 may be executed to refine the predictive model 210 and/or relay settings 140, respectively.

Figure 3:
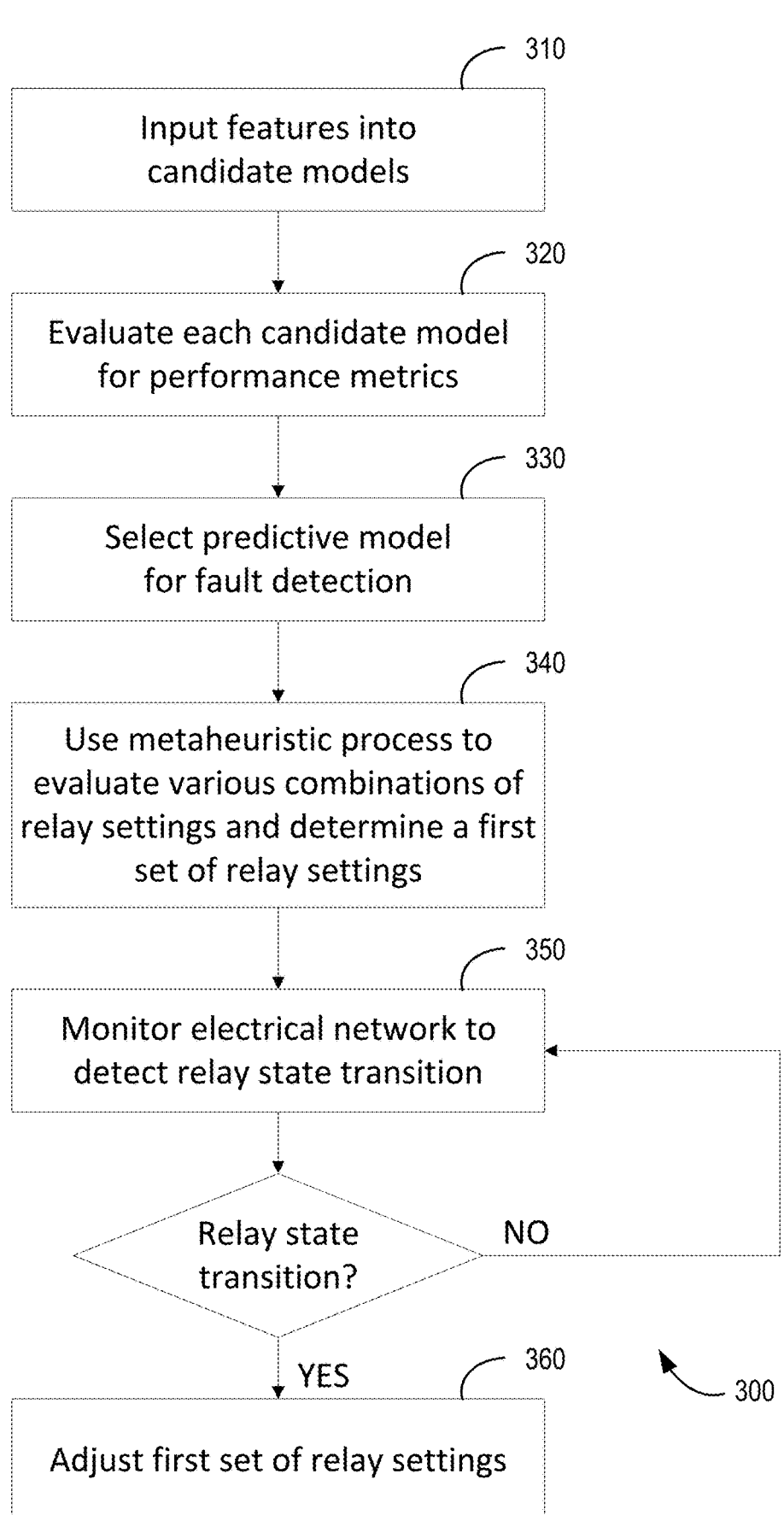
FIG. 3 is a flowchart illustrating an example method for implementing an adaptive system, such as the adaptive system shown in FIG. 2.

FIG. 3 shows an example method 300 for implementing the adaptive system 200 to enhance relay performance. At operation 310, a plurality of features associated with relay operational profile data (e.g., data 202) is input into a plurality of candidate models (e.g., candidate models 222). The features may include, without limitation, time-based characteristics (e.g., trends or patterns in relay operation), statistical parameters (e.g., averages or standard deviations of system measurements), and anomalous behavior indicators (e.g., deviations from expected operational norms). These features may be extracted from historical or real-time operational data and serve as inputs for evaluating candidate models.

At operation 320, each candidate model is evaluated for one or more performance metrics, including sensitivity (e.g., the ability to correctly detect actual faults) and specificity (e.g., the ability to correctly identify normal operating conditions). During this operation, fault-related patterns may be identified in the relay operational profile data, which may include detecting conditions such as overcurrent, differential current, or time-inverse current behaviors.

At operation 330, a predictive model (e.g., predictive model 210) is selected from the candidate models based on the evaluation metrics, including sensitivity and specificity. The predictive model may be optimized for fault detection while minimizing false alarms. For example, the predictive model may be chosen using double cross-validation techniques to ensure robustness and reliability in its fault detection capabilities under varying network conditions.

At operation 340, a metaheuristic process may be employed (e.g., using metaheuristic module 230) to evaluate various combinations of relay settings (e.g., relay settings 140) for each numerical relay (e.g., numerical relay 110) in the system. This process determines a first set of relay settings based on the evaluation, including, without limitation, time multiplier settings, current threshold settings, and curve characteristics (e.g., inverse time, very inverse time, or extremely inverse time). The metaheuristic process (e.g., genetic algorithms) explores the parameter space efficiently to identify optimal settings that balance fault detection accuracy and system performance.

At operation 350, the adaptive system monitors the relay performance and network conditions to detect one or more relay state transitions. These transitions, indicative of changes in relay behavior or network dynamics, may include states such as "idle," "armed," or "activated" (e.g., upon fault detection). The system uses tools like a Markov Counter (e.g., Markov module 240) to probabilistically measure and track these transitions over time.

At operation 360, on the condition that one or more relay state transitions are detected, the first set of relay settings is adjusted to enhance the performance of the system. The adjustments may involve recalibrating settings to accommodate the new network conditions or refining fault detection thresholds to ensure both system protection and stability. For significant changes, additional evaluations may involve invoking the Nodal Fault Predictor 220 or re-running the metaheuristic module 230 to refine the predictive model and relay configurations further.

Figure 4:
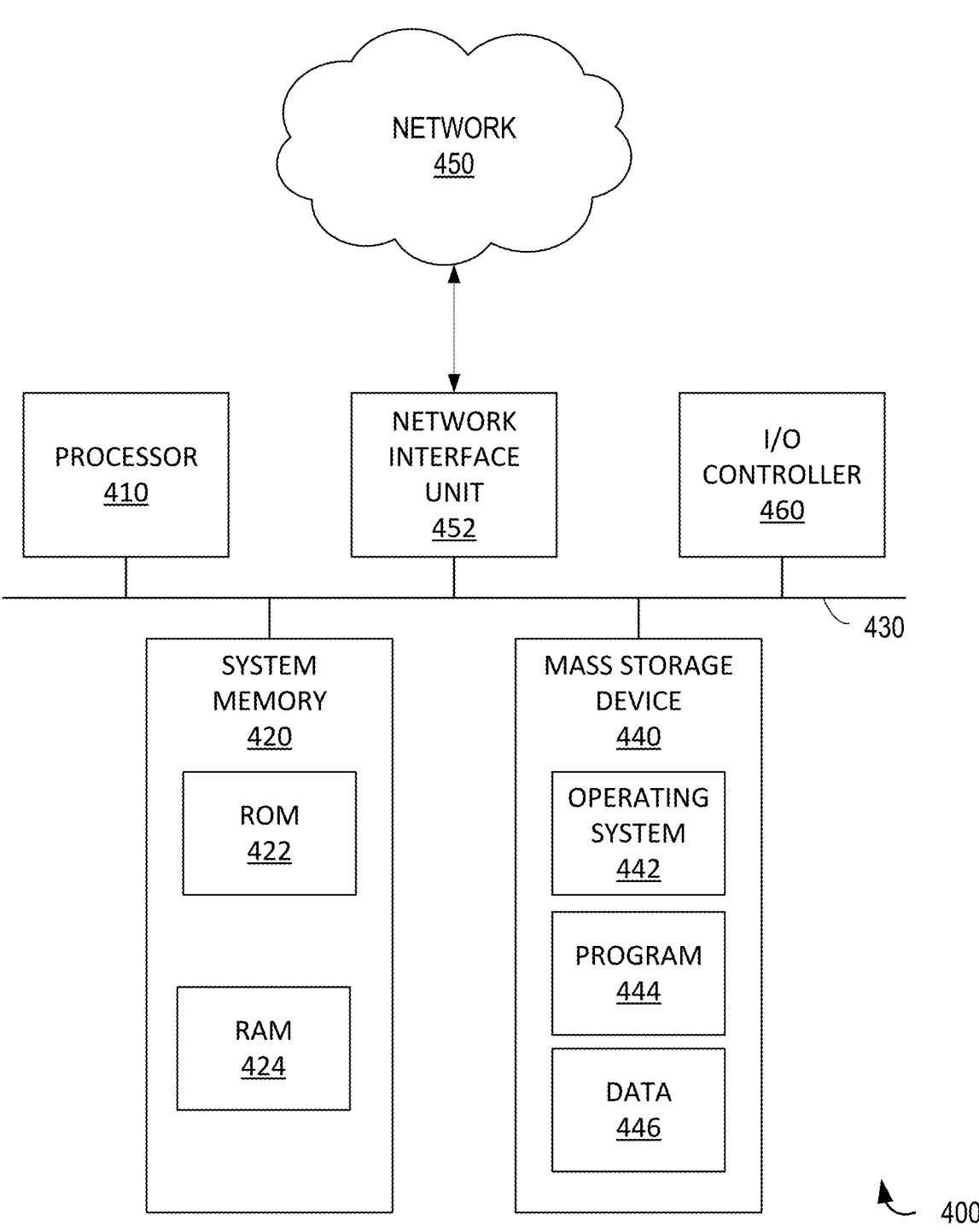
FIG. 4 is a computer architecture diagram illustrating an computing system that may be used to perform one or more computing operations described herein, such as those implemented by the adaptive system shown in FIG. 2 and/or the method shown in FIG. 3.

FIG. 4 shows an example computing system 400 (e.g., numerical relay 110, adaptive system 200) configured to perform one or more computing operations described herein. In some examples, the computing system 400 includes a processor 410, a system memory 420, and a bus 430 coupling various system components including the system memory 420 to the processor 410.

The processor 410 is configured to perform general computing functions and process data and instructions to perform one or more operations and/or provide other functionality described herein. For example, the processor 410 may access the system memory 420 to read data and instructions from and/or write data and instructions to the system memory 420 for use in executing one or more computer-executable instructions. In this manner, the processor 410 may be programmed to execute any aspect of the software components described herein, including software components for executing, implementing, and/or employing the microprocessor logic 130 (shown in FIG. 1), protection modules 150 (shown in FIG. 1), nodal fault predictor 220 (shown in FIG. 2), metaheuristic module 230 (shown in FIG. 2), Markov module 240 (shown in FIG. 2), and/or method 300 (shown in FIG. 3). In some examples, the processor 410 may be or include any quantity of processing units including a central processing unit, a graphics processing unit, a field-programmable gate array (FPGA), a digital signal processor (DSP), or other hardware logic components including, without limitation, an Application-Specific Integrated Circuit (ASIC), Application-Specific Standard Product (ASSP), System-on-a-Chip System (SOC), Complex Programmable Logic Device (CPLD), etc.

The system memory 420 includes any combination of computer-readable media that may be accessed by the processor 410. In some examples, the system memory 420 includes a read-only memory (ROM) 422 which stores instructions for executing basic functions and a random access memory (RAM) 424 which temporarily stores data and instructions for actively used programs. For example, the RAM 424 may be used to host or store user data, device data, system data, and the like, as well as one or more software components for executing, implementing, and/or employing the microprocessor logic 130 (shown in FIG. 1), protection modules 150 (shown in FIG. 1), nodal fault predictor 220 (shown in FIG. 2), metaheuristic module 230 (shown in FIG. 2), Markov module 240 (shown in FIG. 2), and/or method 300 (shown in FIG. 3).

Computer-readable media includes both communication media and computer storage media. Communication media typically embody computer-readable instructions, data structures, program modules, or other data in a modulated data signal, such as a carrier wave or other transport mechanism. The term "modulated data signal" means a signal that has one or more of its characteristics set or changed in a manner as to encode information in the signal. By way of example, and not limitation, communication media includes wired media, such as a wired network or direct-wired connection, and wireless media, such as acoustic, radio frequency, and infrared media.

In contrast, computer storage media include tangible forms of media that can store information such as computer-readable instructions, data structures, program modules, or other data. By way of example, and not limitation, computer storage media includes ROM 422, RAM 424, hard disk drives (HDDs), solid-state drives (SSDs), external hard drives, flash drives, optical storage media (e.g., compact discs (CDs), digital versatile discs (DVDs), and magnetic storage media (e.g., tape drives). For purposes of the present disclosure, computer storage media is mutually exclusive to communication media and excludes waves, signals, and other transitory or intangible forms of media.

It should be appreciated that the software components described herein, when loaded into the processor 410 and executed, may transform the processor 410 and the overall computing system 400 from a general-purpose computing system into a special-purpose computing system customized to facilitate the functionality described herein. More specifically, the computer-executable instructions contained within the software components described herein transform the processor 410 to operate or function as a finite-state machine by specifying how the processor 410 transitions between states, thereby transforming the transistors or other discrete circuit elements constituting the processor 410.

Encoding the software components described herein may also transform the physical structure of the computer-readable media described herein. The specific transformation of physical structure may depend on various factors, in different implementations of the present disclosure. Examples of such factors may include, but are not limited to, the technology used to implement the computer-readable media, whether the computer-readable media is characterized as primary or secondary storage, and the like. For example, if the computer-readable media is implemented as semiconductor-based memory, the software disclosed herein may be encoded on the computer-readable media by transforming the physical state of the transistors, capacitors, or other discrete circuit elements constituting the semiconductor-based memory. The software also may transform the physical state of such components in order to store data thereupon.

As another example, the computer-readable media disclosed herein may be implemented using magnetic or optical technology. In such implementations, the software presented herein may transform the physical state of magnetic or optical media, when the software is encoded therein. These transformations may include altering the magnetic characteristics of particular locations within given magnetic media. These transformations also may include altering the physical features or characteristics of particular locations within given optical media, to change the optical characteristics of those locations. Other transformations of physical media are possible without departing from the scope and spirit of the present description, with the foregoing examples provided only to facilitate this discussion.

In some examples, the computing system 400 includes a mass storage device 440 coupled to the processor 410 for hosting or storing data and instructions, such as an operating system 442, one or more programs 444, and/or data 446. One of ordinary skill in the art would understand that copies of at least some data and/or instructions hosted or stored in the mass storage device 440 may be at least temporarily stored in the system memory 420 to enable the computing system 400 to function as described herein.

As shown in FIG. 4, the computing system 400 may connect to a network 450 through a network interface unit 452 connected to the bus 430. In this manner, the computing system 400 may operate in a networked environment in which the computing system 400 may use one or more remote devices (not shown) to host or store at least some data and/or to execute at least some instructions. Computer communication between computing systems can be a network transfer, a file transfer, an applet transfer, an email, a hypertext transfer protocol (HTTP) transfer, and so on.

In some examples, the computing system 400 may include one or more input/output (I/O) controllers 460 that facilitate communication and data transfer between the processor 410 and one or more I/O devices (not shown) configured to provide input and/or output capabilities. For example, a user may enter commands and information into the computing system 400 using one or more input devices, such as a keyboard, pointing device (e.g., mouse, trackball, touch pad, stylus), microphone, camera, scanner, accelerometer, and the like. Additionally or alternatively, the computing system 400 may present various forms of information, such as text, images, audio, video, alerts, and the like, using one or more output devices, such as a monitor, projector, printer, speaker, actuator, and the like. In some examples, the output device may be integrated with the input device (e.g., in a touchscreen panel or in a controller including a vibrating component).

While some examples are illustrated and described herein with reference to the computing system 400 being, including, or being included in the numerical relay 110 (shown in FIG. 1 and/or adaptive system 200 (shown in FIG. 2), aspects of the present disclosure are operable with any computing system that can execute computer-executable instructions to implement the operations and functionality associated with the computing system 400. It is also contemplated that the computing system 400 may not include all of the components shown in FIG. 4, may include other components that are not explicitly shown in FIG. 4, or may utilize an architecture completely different than that shown in FIG. 4. The computing system 400 should not be interpreted as having any dependency or requirement relating to any one or combination of components shown in FIG. 4. The computing system 400 is only one example of a computing and networking environment for performing one or more computing operations and is not intended to suggest any limitation as to the scope of use or functionality of the present disclosure.

Example methods and systems are described herein for enhancing reliability, resilience, and/or performance of power systems. For example, changes in relay operational profiles may help diagnose or identify shifts in network conditions and electrical system behaviors that may indicate or reveal issues such as fault conditions, protection miscoordination, or changes in power flow patterns. Examples described herein monitor relay operational data over time and use advanced modeling techniques to conduct performance evaluations and implement adaptive protection schemes. Accordingly, examples described herein provide an accurate, data-driven solution for effective detection and prediction of fault conditions in electrical networks through intelligent relay setting adaptation. In view of the above, it will be seen that several advantages of the adaptive relay system are achieved and other advantageous results attained.

Although described in connection with an example computing system environment, examples of the present disclosure are capable of implementation with numerous other general purpose or special purpose computing system environments, configurations, or devices. Examples of well-known computing systems, environments, and/or configurations that may be suitable for use with aspects of the disclosure include, but are not limited to, server computers, desktop computers, laptop computers, tablets, mobile devices, communication devices in wearable or accessory form factors, microprocessor-based systems, multiprocessor systems, programmable consumer electronics, kiosks, table-top devices, industrial control devices, minicomputers, mainframe computers, network computers, distributed computing environments that include any of the above systems or devices, and the like.

Examples of the present disclosure may be described in the general context of computer-executable instructions, such as program modules, executed by one or more computers or other devices in software, firmware, hardware, or a combination thereof. The computer-executable instructions may be organized into one or more computer-executable modules or components. Generally, program modules include, but are not limited to, routines, objects, components, and data structures that perform particular tasks or implement particular abstract data types. Aspects of the disclosure may be implemented with any number and organization of such modules or components. For example, aspects of the present disclosure are not limited to the specific computer-executable instructions or the specific components or modules illustrated in the figures and described herein. Other examples of the present disclosure may include different computer-executable instructions or components having more or less functionality than illustrated and described herein.

In some examples, the operations illustrated in the drawings may be implemented as software instructions encoded on a computer readable medium, in hardware programmed or designed to perform the operations, or both. For example, aspects of the present disclosure may be implemented as a system on a chip or other circuitry including a plurality of interconnected, electrically conductive elements.

It is possible for one or more elements of an implementation of an apparatus as described herein to be used to perform tasks or execute other sets of instructions that are not directly related to an operation of the apparatus, such as a task relating to another operation of a device or system in which the apparatus is embedded. It is also possible for one or more elements of an implementation of such an apparatus to have structure in common (e.g., a processor used to execute portions of code corresponding to different elements at different times, a set of instructions executed to perform tasks corresponding to different elements at different times, or an arrangement of electronic and/or optical devices performing operations for different elements at different times).

The order of execution or performance of the operations in examples of the present disclosure illustrated and described herein is not essential, unless otherwise specified. That is, the operations may be performed in any order, unless otherwise specified, and examples of the disclosure may include additional or fewer operations than those disclosed herein. For example, it is contemplated that executing or performing a particular operation before, contemporaneously with, or after another operation is within the scope of aspects of the present disclosure.

The examples illustrated and described herein as well as examples not specifically described herein but within the scope of aspects of the present disclosure constitute example means for implementing an adaptive system. For example, the elements illustrated in FIGS. 1, 2, and 4 when programmed, encoded, or configured to perform the operations illustrated in FIG. 3, constitute at least an example means for inputting a plurality of features associated with relay operational profile data into a plurality of candidate models (e.g., adaptive system 200, nodal fault predictor 220); an example means for evaluating each candidate model of the plurality of candidate models for one or more performance metrics; an example means for selecting a predictive model for fault detection (e.g., adaptive system 200, nodal fault predictor 220); an example means for using a metaheuristic process to evaluate various combinations of relay settings for the one or more numerical relays in the electrical network and determine a first set of relay settings for the one or more numerical relays based on the evaluation (e.g., adaptive system 200, metaheuristic module 230); an example means for monitoring the electrical network to detect one or more relay state transitions indicative of one or more changes in relay performance or network conditions (e.g., adaptive system 200, Markov module 240); and an example means for adjusting the first set of relay settings to enhance performance of the electrical network (e.g., adaptive system 200 Markov module 240).

When introducing elements of aspects of the disclosure or the examples thereof, the articles "a," "an," "the," and "said" are intended to mean that there are one or more of the elements. Furthermore, references to an "embodiment" or "example" of the present disclosure are not intended to be interpreted as excluding the existence of additional embodiments or examples that also incorporate the recited features. The terms "comprising," "including," and "having" are intended to be inclusive and mean that there may be additional elements other than the listed elements. The phrase "one or more of the following: A, B, and C" means "at least one of A and/or at least one of B and/or at least one of C."

The term "determining" encompasses a wide variety of actions and, therefore, "determining" can include calculating, computing, processing, deriving, investigating, looking up (e.g., looking up in a table, a database or another data structure), ascertaining and the like. Also, "determining" can include receiving (e.g., receiving information), accessing (e.g., accessing data in a memory) and the like. Also, "determining" can include resolving, selecting, choosing, establishing and the like.

In the present description, reference numbers have sometimes been used in connection with various terms. Where a term is used in connection with a reference number, this may be meant to refer to a specific element that is shown in one or more of the figures. Where a term is used without a reference number, this may be meant to refer generally to the term without limitation to any particular figure.

Having described aspects of the disclosure in detail, it will be apparent that modifications and variations are possible without departing from the scope of aspects of the disclosure as defined in the appended claims. As various changes could be made in the above constructions, products, and methods without departing from the scope of aspects of the disclosure, it is intended that all matter contained in the above description and shown in the accompanying drawings shall be interpreted as illustrative and not in a limiting sense.

While aspects of the present disclosure have been described in terms of various examples with their associated operations, a person skilled in the art would appreciate that a combination of operations from any number of different examples is also within the scope of the aspects of the present disclosure.

What is claimed is:

1. A method for implementing an adaptive system for use with one or more numerical relays, the method comprising:
inputting a plurality of features associated with relay operational profile data into a plurality of candidate models;
evaluating each candidate model of the plurality of candidate models for one or more performance metrics including sensitivity and specificity to identify one or more fault-related patterns in the relay operational profile data;
selecting, from the plurality of candidate models, a predictive model for fault detection based on the sensitivity and specificity of the predictive model;
using a metaheuristic process to evaluate various combinations of relay settings for the one or more numerical relays in an electrical network and determine a first set of relay settings for the one or more numerical relays based on the evaluation;
monitoring the electrical network to detect one or more relay state transitions indicative of one or more changes in relay performance or network conditions; and
on condition that one or more relay state transitions are detected, adjusting the first set of relay settings to enhance performance of the electrical network.

2. The method of claim 1, further comprising using root mean square (RMS) analysis to extract one or more magnitude-related features from the relay operational profile data, wherein the one or more magnitude-related features are included in the plurality of features.

3. The method of claim 1, further comprising using Wavelet-Gabor Transformation to extract one or more transient features from the relay operational profile data, wherein the one or more transient features are included in the plurality of features.

4. The method of claim 1, further comprising extracting the plurality of features from historical operational data associated with the electrical network.

5. The method of claim 1, further comprising extracting the plurality of features from simulated operational data associated with the electrical network.

6. The method of claim 1, further comprising:
identifying a plurality of options for the first set of relay settings; and
evaluating the plurality of options based on one or more contextual factors, wherein the first set of relay settings are determined based on the evaluation.

7. The method of claim 1, further comprising identifying a plurality of options for the first set of relay settings, wherein the plurality of options include a range of pick-up thresholds for each of the one or more numerical relays, and the first set of relay settings includes a first pick-up threshold selected from the range of pick-up thresholds.

8. The method of claim 1, further comprising identifying a plurality of options for the first set of relay settings, wherein the plurality of options include a plurality of operating modes for each of the one or more numerical relays, and the first set of relay settings includes a first operating mode selected from the plurality of operating modes.

9. The method of claim 1, further comprising identifying a plurality of options for the first set of relay settings, wherein the plurality of options include a plurality of time setting multiplier values for each of the one or more numerical relays, and the first set of relay settings includes a first time setting multiplier value selected from the plurality of time setting multiplier values.

10. The method of claim 1, further comprising on condition that no relay state transitions are detected over a predefined period, reducing a frequency at which machine learning models are applied to analyze relay performance or network conditions.

11. The method of claim 1, wherein the first set of relay settings are adjusted in accordance with a relevant standard.

12. The method of claim 1, further comprising:

determining whether the one or more relay state transitions are related to a sensitive parameter; and on condition that the one or more relay state transitions are related to the sensitive parameter, conducting a high-voltage transient analysis including an Electrical Transient Analyzer Program (ETAP) study.

13. The method of claim 1, further comprising:

determining whether the one or more relay state transitions are related to a sensitive parameter; and on condition that the one or more relay state transitions are related to the sensitive parameter, generating a notification for a professional engineer to review.

14. An adaptive system for use with one or more numerical relays, the adaptive system comprising:

a nodal fault predictor configured to input a plurality of features associated with relay operational profile data into a plurality of candidate models, evaluate each candidate model of the plurality of candidate models for one or more performance metrics including sensitivity and specificity to identify one or more fault-related patterns in the relay operational profile data, and select a predictive model from the plurality of candidate models for fault detection based on the sensitivity and specificity of the predictive model;

a metaheuristic module configured to evaluate various combinations of relay settings for the one or more numerical relays in an electrical network and determine a first set of relay settings for the one or more numerical relays based on the evaluation; and a monitoring module configured to monitor the electrical network to detect one or more relay state transitions indicative of one or more changes in relay performance or network conditions, and, on condition that one or more relay state transitions are detected, adjust the first set of relay settings to enhance performance of the electrical network.

15. The adaptive system of claim 14, wherein the nodal fault predictor is configured to use root mean square (RMS) analysis to extract one or more magnitude-related features from the relay operational profile data and Wavelet-Gabor Transformation to extract one or more transient features from the relay operational profile data, wherein the one or more magnitude-related features and the one or more transient features are included in the plurality of features.

16. The adaptive system of claim 14, wherein the nodal fault predictor is configured to extract the plurality of features from historical operational data and simulated operational data associated with the electrical network.

17. The adaptive system of claim 14, wherein the metaheuristic module is configured to identify a plurality of options for the first set of relay settings, and evaluating the plurality of options based on one or more contextual factors, wherein the first set of relay settings are determined based on the evaluation.

18. The adaptive system of claim 14, wherein the metaheuristic module is configured to identify a plurality of options for the first set of relay settings, wherein the plurality of options include a range of pick-up thresholds, a plurality of operating modes, and a plurality of time setting multiplier values for each of the one or more numerical relays, and the first set of relay settings includes a first pick-up threshold selected from the range of pick-up thresholds, a first operating mode selected from the plurality of operating modes, and a first time setting multiplier value selected from the plurality of time setting multiplier values.

19. The adaptive system of claim 14, where the monitoring module is configured to:

determine whether the one or more relay state transitions are related to a sensitive parameter; and on condition that the one or more relay state transitions are related to the sensitive parameter, conducting a high-voltage transient analysis including an Electrical Transient Analyzer Program (ETAP) study, and generating a notification for a professional engineer to review.

20. A system for implementing an adaptive system, the system comprising:

one or more numerical relays; and a computing device configured to input a plurality of features associated with relay operational profile data into a plurality of candidate models, evaluate each candidate model of the plurality of candidate models for one or more performance metrics including sensitivity and specificity to identify one or more fault-related patterns in the relay operational profile data, selecting, from the plurality of candidate models, a predictive model for fault detection based on the sensitivity and specificity of the predictive model, using a metaheuristic process to evaluate various combinations of relay settings for the one or more numerical relays in an electrical network and determine a first set of relay settings for the one or more numerical relays based on the evaluation, monitoring the electrical network to detect one or more relay state transitions indicative of one or more changes in relay performance or network conditions, and on condition that one or more relay state transitions are detected, adjusting the first set of relay settings to enhance performance of the electrical network.

* * * * *